United States Patent
Nakazato et al.

(10) Patent No.: US 6,833,736 B2
(45) Date of Patent: Dec. 21, 2004

(54) PULSE GENERATING CIRCUIT

(75) Inventors: Takaaki Nakazato, Austin, TX (US); Toru Asano, Austin, TX (US); Osamu Takahashi, Round Rock, TX (US); Sang Dhong, Austin, TX (US); Atsushi Kawasumi, Austin, TX (US)

(73) Assignees: Toshiba America Electronic Components, Inc., Irvine, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/359,805

(22) Filed: Feb. 7, 2003

(65) Prior Publication Data

US 2004/0155688 A1 Aug. 12, 2004

(51) Int. Cl.$^7$ .............................. H03K 9/08; G01R 29/02
(52) U.S. Cl. .......................... 327/34; 327/36; 327/173; 327/174
(58) Field of Search ............................. 327/34, 35, 36, 327/552, 172, 173, 174, 175, 176

(56) References Cited

U.S. PATENT DOCUMENTS

| | | | | |
|---|---|---|---|---|
| 4,760,279 A | * | 7/1988 | Saito et al. ................ | 327/34 |
| 5,198,710 A | * | 3/1993 | Houston ................... | 327/552 |
| 5,268,594 A | * | 12/1993 | Huang ..................... | 327/172 |
| 5,600,274 A | * | 2/1997 | Houston ................... | 327/262 |
| 5,748,034 A | * | 5/1998 | Ketineni et al. ............ | 327/551 |
| 5,760,612 A | * | 6/1998 | Ramirez ................... | 327/34 |
| 5,764,090 A | * | 6/1998 | Yeh et al. ................. | 327/174 |
| 5,821,793 A | | 10/1998 | Ohta et al. ............... | 327/277 |
| 5,905,392 A | * | 5/1999 | Chun ..................... | 327/198 |
| 5,969,555 A | * | 10/1999 | Suda ...................... | 327/172 |
| 6,208,180 B1 | | 3/2001 | Fisch et al. .............. | 327/141 |
| 6,249,150 B1 | | 6/2001 | Matsui .................... | 326/93 |
| 6,262,613 B1 | * | 7/2001 | Hirota .................... | 327/176 |
| 6,269,051 B1 | | 7/2001 | Funaba et al. ............. | 365/233 |

* cited by examiner

Primary Examiner—Tuan T. Lam
(74) Attorney, Agent, or Firm—Hogan & Hartson, LLP

(57) ABSTRACT

A pulse generator circuit includes a first logic means, a second logic means, a first delay means, and a second delay means. The first logic means is for receiving an input clock signal. The first delay means is for delaying the input clock signal by a first delay time. The second logic means is for receiving a signal output from the first logic means. The second delay means is for delaying the signal output from the first logic means by a second delay time.

30 Claims, 4 Drawing Sheets

PULSE GENERATING CIRCUIT

FIELD OF THE INVENTION

The present invention relates to pulse generating circuitry, and in particular, to a pulse generating circuit for generating a pulse signal with a pulse width that is approximately greater than or equal to half the period of an input clock signal.

BACKGROUND OF THE INVENTION

Pulse generator circuits are commonly used in digital logic applications for generating electrical pulse signals that are triggered as a result of an input clock signal. Often, the pulse generator circuits are used to generate an output pulse signal having a pulse width that is less than half the length of the input clock signal.

FIG. 1 is an example schematic diagram of a pulse generator circuit 10. NCLK is an input clock signal 12 that is input to a two-input NOR gate 14. The input clock signal NCLK also passes through three series-connected inverters 16, 18, and 20 and into the two-input NOR gate. Each inverter delays the input clock signal NCLK by one gate, thus, the three series-connected inverters delay the input clock signal NCLK by a total of three gate before the three-times inverted input clock signal NCLK is input to the two-input NOR gate. Thus, the output pulse signal D 22 is generated by NORing the input clock signal NCLK and the three-times inverted input clock signal NCLK.

FIG. 2 is a timing diagram showing the operation of the pulse generator circuit 10 of FIG. 1. As shown in FIG. 2, NCLK 12 has a period 23 of ten gate and a 50:50 duty cycle. D 22 is an output pulse signal whose leading edge 24 is triggered by the falling edge 26 of NCLK. Also, the pulse width 28 of output pulse signal D is determined by the number of inverter delays which in this case is three gate.

One problem associated with the pulse generator circuit 10 of FIG. 1 is that the number of inverters cannot be increased so that the pulse width 28 of the output signal D 22 is approximately half the period of the input clock signal NCLK 12. For example, if the pulse generator circuit of FIG. 1 includes more than five series-connected inverters, the width 28 of the output pulse signal D exceeds five gate and a rising edge 30 of the input clock signal NCLK occurs faster than an expected rising edge of a signal DLY 32 output from the third inverter 20. Therefore, the rising edge of the input clock signal NCLK limits the width of the output pulse signal D to less than half the period of the input clock signal NCLK. Thus, there is a need for a pulse generator circuit that can generate an output pulse signal having a pulse width approximately equal to, or greater than, half the period of the input clock signal.

SUMMARY OF THE INVENTION

An exemplary system that embodies the invention is a pulse generator circuit including a first logic element, a first delay element, a second logic element, and a second delay element. The first logic element has one input for receiving an input clock signal. The first delay element is for delaying the input clock signal by a first delay time. The first delay element has one end for receiving the input clock signal and another end coupled to another input of the first logic element. The second logic element has one input for receiving a signal output from the first logic element where the one input is coupled to an output of the first logic element. The second delay element is for delaying the signal output from the first logic element by a second delay time. The second delay element is coupled at one end to the output of the first logic element and coupled at another end to another input of the second logic element.

Another pulse generator circuit includes a first logic means, a first delay means, a second logic means, and a second delay means. The first logic means is for receiving an input clock signal. The first delay means is for delaying the input clock signal by a first delay time. The second logic means is for receiving a signal output from the first logic means. The second delay means is for delaying the signal output from the first logic means by a second delay time.

A method for generating a pulse signal includes receiving an input clock signal at an input of a first logic element, delaying the input clock signal by a first delay time, receiving the input clock signal delayed by a first delay time at another input of the first logic element, receiving an output signal from the first logic element at an input of a second logic element, delaying the output signal from the first logic element by a second delay time, and receiving the output signal from the first logic element delayed by the second delay time at another input to the second logic element.

Other aspects of the present invention will become readily apparent to those skilled in the art from the following detailed description, which shows and describes exemplary embodiments of the invention, simply by way of illustration of the best mode contemplated for carrying out the invention. The invention is capable of other and different embodiments, and its several details are capable of modifications in various respects, all without departing from the invention. Accordingly, the drawings and description are to be regarded as illustrative in nature, and not as restrictive.

BRIEF DESCRIPTION OF THE DRAWINGS

Various features, aspects, and advantages of the invention will be better understood with regard to the following description, appended claims, and accompanying drawings where:

DETAILED DESCRIPTION OF THE PREFERRED EMBODIMENTS

Figure 3:
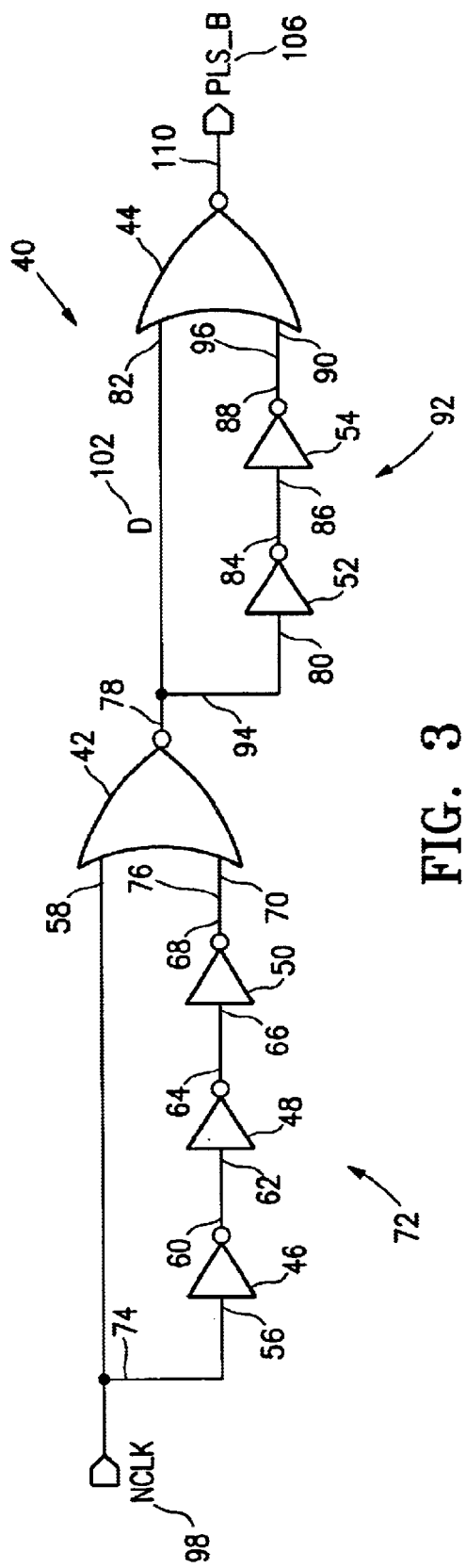
FIG. 3 is a schematic diagram of a pulse generator circuit according to an embodiment of the invention.

An embodiment of the present invention involves a pulse generator circuit 40 composed of logic gates as shown in FIG. 3. The pulse generator circuit includes a first logic means 42 and a second logic means 44, or a first logic element and a second logic element, respectively. The first logic element is a first two-input NOR gate and the second logic element is a second two-input NOR gate. The pulse generator circuit also includes a first inverter 46, second inverter 48, third inverter 50, fourth inverter 52, and fifth inverter 54.

The input 56 of the first inverter 46 is coupled to one input 58 of the first NOR gate 42. The output 60 of the first inverter is coupled to the input 62 of the second inverter 48. Similarly, the output 64 of the second inverter is coupled to the input 66 of the third inverter 50. The output 68 of the third inverter is coupled the other input 70 of the first NOR gate. Thus, the first, second, and third inverters are connected in series and form a first delay means 72 or a first delay element with both ends 74 and 76 of the first delay element coupled to an input 58 and 70 of the first NOR gate.

The output 78 of the first NOR gate 42 is coupled to both the input 80 of the fourth inverter 52 and one input 82 of the second NOR gate 44. The output 84 of the fourth inverter is coupled to the input 86 of the fifth inverter 54. The output 88 of the fifth inverter is coupled to the other input 90 of the second NOR gate. Thus, the fourth and fifth inverters are connected in series and form a second delay means 92 or a second delay element with one end 94 coupled to both the output of the first NOR gate and the input of the second NOR gate and the other end 96 coupled to the other input 90 of the second NOR gate.

Figure 4:
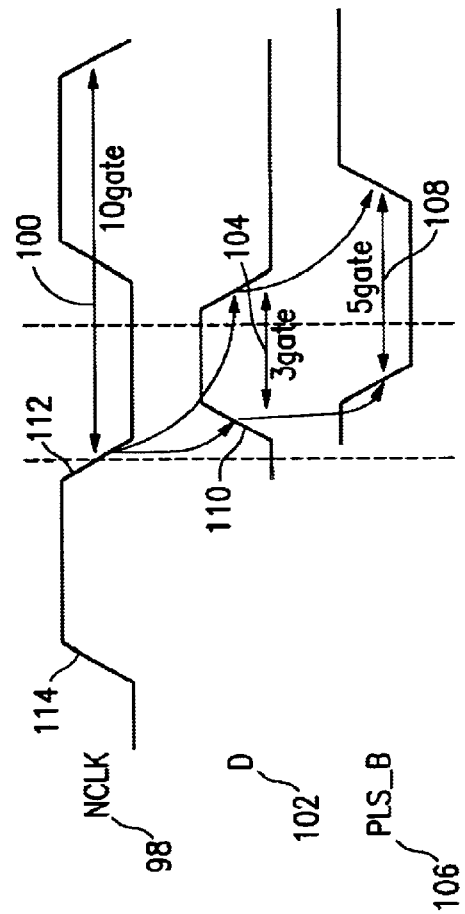
FIG. 4 is a timing diagram showing the operation of the pulse generator circuit of FIG. 3.

Referring additionally to FIG. 4, in operation, a clock signal NCLK 98 having a period 100 of ten gate and a 50:50 duty cycle is received by one input 58 of the first NOR gate 42 and the input 56 of the first inverter 46 which constitutes an end 74 of the first delay element 72 for receiving the input clock signal NCLK. The input clock signal NCLK propagates through the first, second, and third inverters 46, 48, and 50, respectively, and as a result is delayed by a first delay time. After propagating through the first, second, and third inverters, the input clock signal NCLK is input to the other input 70 of the first NOR gate. The output 78 of the first NOR gate is pulse signal D 102 that has a pulse width 104 of three gate which is less than half the period of the input clock signal NCLK. Pulse signal D is then input to one input 82 of the second NOR gate 44. Pulse signal D propagates through the fourth and fifth inventers 52 and 54, respectively, and, as a result, is delayed by a second delay time. After propagating through the fourth and fifth inverters, the pulse signal D is input to the other input 90 of the second NOR gate. Pulse signal PLS_B 106 having a pulse width 108 of five gate which is half the period of the input clock signal NCLK is produced at the output 110 of the second NOR gate.

Thus, the embodiment of the pulse generator circuit 40 shown in FIG. 3 is a two-stage device. The first stage of the pulse generator circuit includes the first NOR gate 42, first inverter 46, second inverter 48, and third inverter 50. The second stage of the pulse generator circuit includes the second NOR gate 44, fourth inverter 52, and fifth inverter 54. As shown in FIG. 4, pulse signal D 102 that is output from the first stage of the pulse generator circuit has a pulse width 104 of three gate with a leading edge 110 that is triggered by a trailing edge 112 of input clock signal NCLK 98. The second stage of the pulse generator circuit generates output pulse signal PLS_B 106 by inverting and lengthening the pulse width 104 of pulse signal D to five gate.

Figure 1:
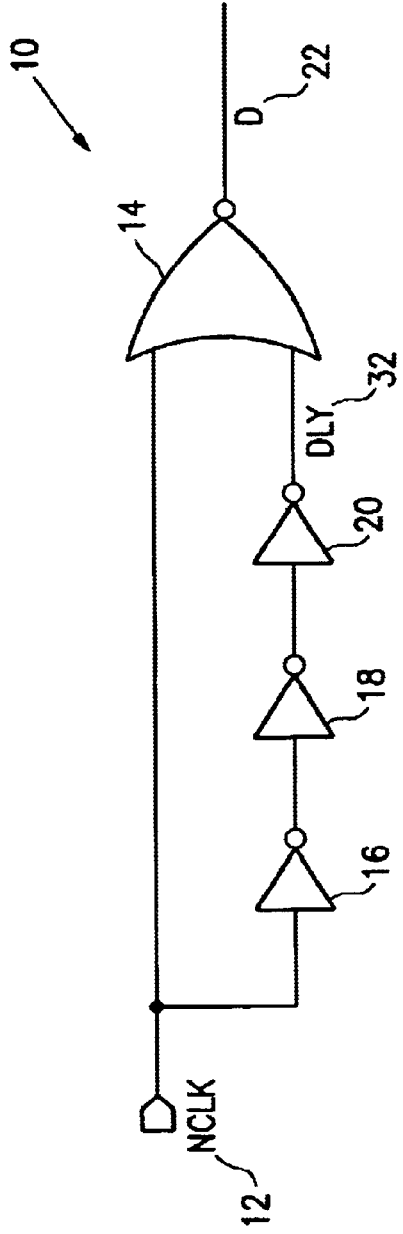
FIG. 1 is a schematic diagram of a prior art pulse generator circuit.
Figure 2:
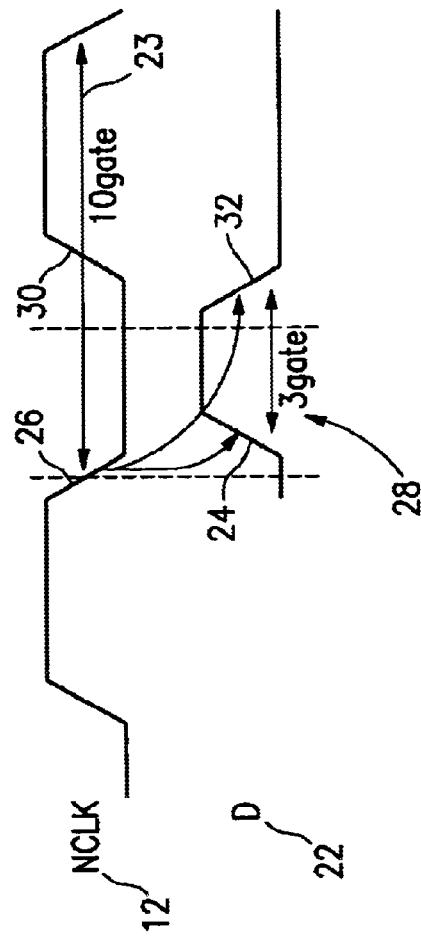
FIG. 2 is a timing diagram showing the operation of the pulse generator circuit of FIG. 1.

Advantageously, the pulse generator circuit 40 depicted in FIG. 3 allows for the output pulse signal PLS_B 106 to have a pulse width 108 of five gate which is half of the input clock signal NCLK's period 100. Thus, the embodiment of FIG. 3 overcomes the pulse width limitation of the pulse generator circuit 10 shown in FIG. 1. Also, in embodiments of the invention, the first and second NOR gates 42 and 44 and first, second, third, fourth, and fifth inverters 46, 48, 50, 52, and 54, respectively, are co-located within a single chip (not shown), and thus, advantageously provide for reduced space requirements and cost. In other embodiments, any of the first and second NOR gates and first, second, third, fourth, and fifth inverters are configured in more than one chip (not shown).

In an alternative embodiment (not shown), the first logic element 42 is a first NAND gate (not shown) and the second logic element 44 is a second NAND gate (not shown). This embodiment of the pulse generator circuit 40 operates similarly to the operation of the embodiment depicted in FIG. 3, however, the output pulse signal PLS_B 106 is triggered by a leading edge 114 of input clock signal NCLK 98 instead of a trailing edge 112.

Figure 5:
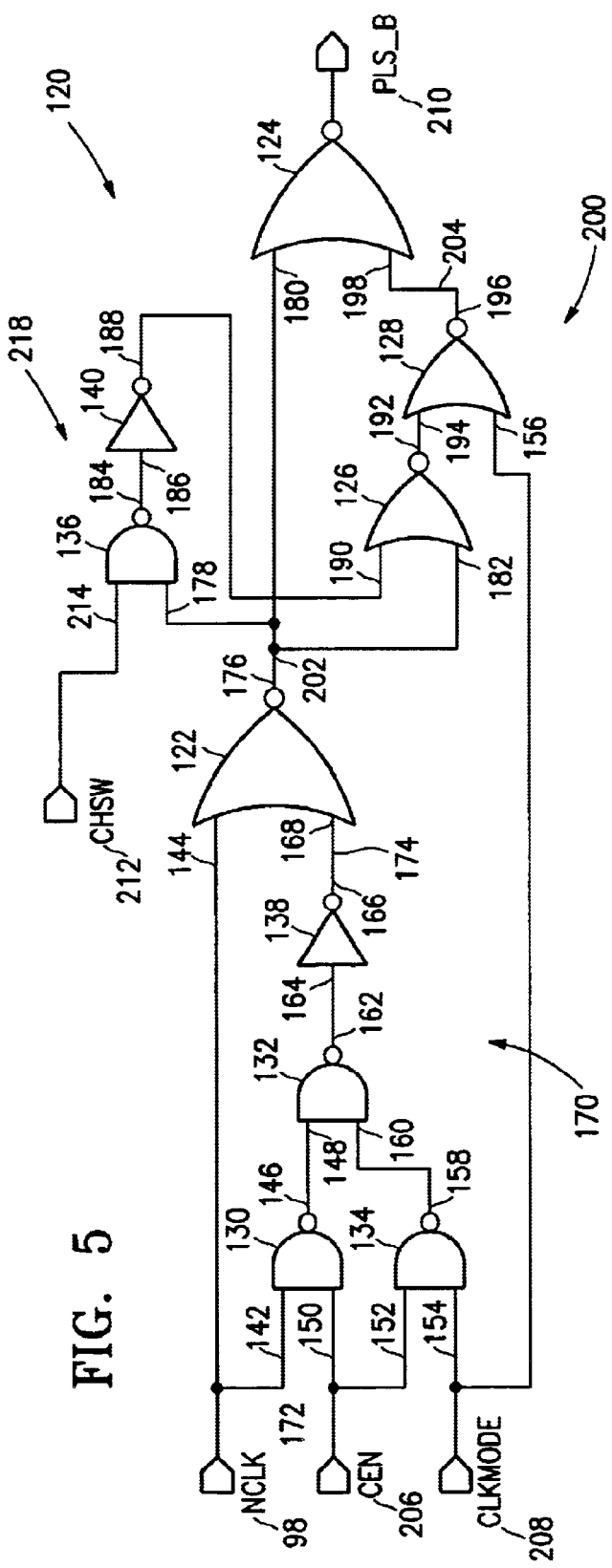
FIG. 5 is a schematic diagram of another pulse generator circuit according to an embodiment of the invention.

FIG. 5 is a schematic diagram that depicts another embodiment of the present invention. The pulse generator circuit 120 shown in FIG. 5 is similar to the pulse generator circuit 40 of FIG. 3 in that it includes a first logic means 122 and a second logic means 124, or a first logic element and a second logic element, respectively. The first logic element is a first two-input NOR gate and the second logic element is a second two-input NOR gate. The pulse generator circuit also includes a third two-input NOR gate 126, fourth two-input NOR gate 128, first two-input NAND gate 130, second two-input NAND gate 132, third two-input NAND gate 134, fourth two-input NAND gate 136, first inverter 138, and second inverter 140.

One input 142 of the first NAND gate 130 is coupled to one input 144 of the first NOR gate 122. The output 146 of the first NAND gate is coupled to one input 148 of the second NAND gate 132. The other input 150 of the first NAND gate is coupled to one input 152 of the third NAND gate 134. The other input 154 of the third NAND gate is coupled to one input 156 of the fourth NOR gate 128. The output 158 of the third NAND gate is coupled to another input 160 of the second NAND gate 132. The output 162 of the second NAND gate is coupled to the input 164 of the first inverter 138. The output 166 of the first inverter is coupled to the other input 168 of the first NOR gate 122. Thus, the first NAND gate, second NAND gate, and first inverter are connected in series and form a first delay means 170 or a first delay element with both ends 172 and 174 of the first delay element coupled to an input 144 and 168 of the first NOR gate.

The output 176 of the first NOR gate 122 is coupled to one input 178 of the fourth NAND gate 136, one input 180 of the second NOR gate 124, and one input 182 of the third NOR gate 126. The output 184 of the fourth NAND gate is coupled to the input 186 of the second inverter 140. The output 188 of the second inverter is coupled to the other input 190 of the third NOR gate 126. The output 192 of the third NOR gate is coupled to the other input 194 of the fourth NOR gate 128. The output 196 of the fourth NOR gate is coupled to the other input 198 of the second NOR gate 124. Thus, the third and fourth NOR gates 126 and 128, respectively, are connected in series and form a second delay means 200 or a second delay element with one end 202 coupled to both the output of the first NOR gate and the input 180 of the second NOR gate, and the other end 204 to the other input 198 of the second NOR gate. Also, the fourth NAND gate 136 and the second inverter 140 are connected in series and form a third logic means or a third logic element.

Figure 6:
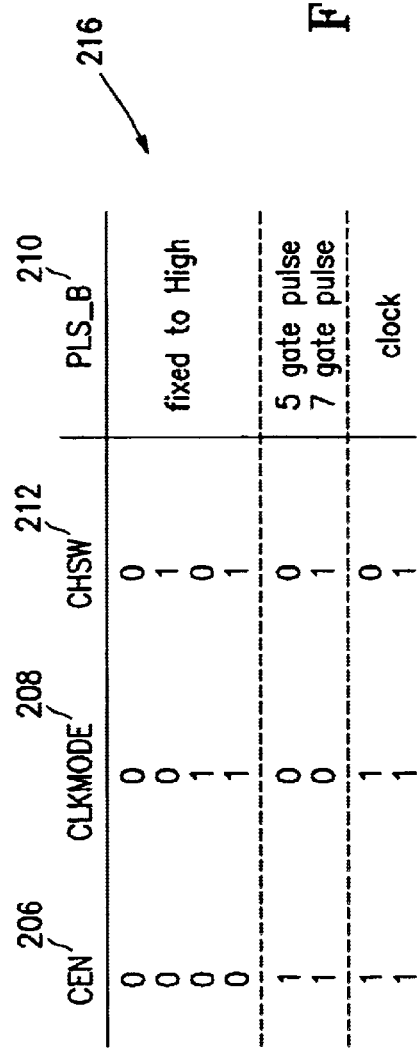
FIG. 6 is a table showing the input and output signals for the pulse generator circuit of FIG. 5.
Figure 7:
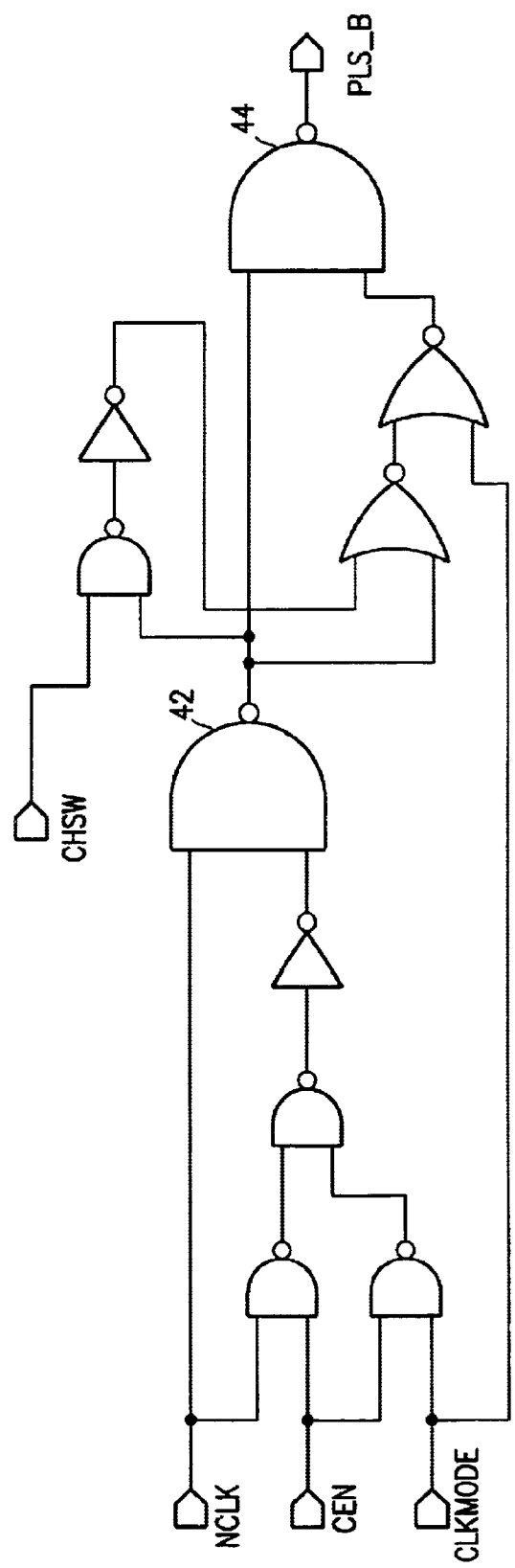
FIG. 7 is a schematic diagram of another embodiment of the present invention.

Referring additionally to FIGS. 4 and 6, an input clock signal NCLK 98 is input to one input 144 of the first NOR gate 122 and one input 142 of the first NAND gate 130 which constitutes an end 172 of the first delay element 170 for receiving the input clock signal NCLK. Also, an enable signal CEN 206, which disables the pulse generator circuit 120 to prevent unwanted power dissipation, is input to the other input 150 of the first NAND gate and one input 152 of the third NAND gate 134. In addition, a mode select signal CLKMODE 208 for selecting whether the signal PLS__B 210 output from the second NOR gate 124 is a pulse signal or a periodic signal having both a period 100 and duty cycle that matches the input clock signal NCLK is input to the other input 154 of the third NAND gate. Furthermore, a pulse lengthening select signal CHSW 212 for selecting whether an output signal PLS__B 210 has a pulse width 108 of five gate or seven gate is input to another input 214 of the fourth NAND gate 136.

In operation, FIG. 6's table 216 indicates that when the enable signal CEN 206 is low "0", the output signal PLS__B 210 is held high and the pulse generator circuit 120 is disabled regardless of the state of the mode select signal CLKMODE 208 or the pulse lengthening select signal CHSW 212. Thus, the output signal PLS__B from the second NOR gate 124 is held at a fixed level in response to the value of the enable signal CEN. In particular, when the enable signal CEN is low, the signal output from both the first and third NAND gates 130 and 134, respectively, is high "1", the signal output from the second NAND gate 132 is low, the signal output from the first inverter 138 is high, the signal output from the first NOR gate 122 is low, the signal output from the fourth NAND gate 136 is high, the signal output from the second inverter 140 is low, the signal output from the third NOR gate 126 is high, the signal output from the fourth NOR gate 128 is low, and thus, the output signal PLS__B is held high.

FIG. 6 also indicates that if the enable signal CEN 206 is high and the mode select signal CLKMODE 208 is high, the output signal PLS__B 212 is a periodic signal having the same period 100 and duty cycle of the input clock signal NCLK 98 regardless of the state of the pulse lengthening select signal CHSW 212. Thus, output signal PLS__B 210 is a pulse signal or a periodic signal in response to the value of the mode select signal CLKMODE. In particular, if the enable signal CEN is high and the mode select signal CLKMODE is high, the signal output from the first NAND gate 130 is low, the output of the third NAND gate 134 is low, the output of the second NAND gate 132 is high, and the output of the first inverter 138 is low. Thus, the output of the first NOR gate 122 is the input clock signal NCLK. Since the mode select signal CLKMODE is high, the signal output from the fourth NOR gate 128 is held low regardless of the signal output from the third NOR gate 126. Because the input clock signal NCLK output from the first NOR gate is input to the second NOR gate 124 along with a low signal output from the fourth NOR gate, the output signal PLS__B from the second NOR gate is the input clock signal NCLK.

When the enable signal CEN 206 is high, mode select signal CLKMODE 208 is low, and the pulse lengthening select signal CHSW 212 is low, the function of the pulse generator circuit 120 of FIG. 5 is similar to that of the pulse generator circuit 40 depicted in FIG. 3. Referring to FIGS. 4, 5, and 6, an input clock signal NCLK 98 having a period 100 of ten gate is input to one input 142 of the first NAND gate 130 and one input 144 of the first NOR gate 122. Since the enable signal CEN is high, the signal output from the first NAND gate is an inverted version of the input clock signal NCLK delayed by one gate. Also, since the enable signal CEN is high, the mode select signal CLKMODE is low, and the signal output from the first NAND gate and the signal input to the other input 148 of the second NAND gate 132 is high, the signal output from the second NAND gate is an inverted version of the signal input to the second NAND gate. The input clock signal NCLK propagates through the first NAND gate, second NAND gate, and first inverter 138 and as a result is delayed by a first delay time of three gate. After propagating through the first and second NAND gates, and the first inverter, the input clock signal NCLK is input to the other input 168 of the first NOR gate.

The signal output from the first NOR gate 122 is pulse signal D 102 that has a pulse width 104 of three gate which is less than half the period of the input clock signal NCLK 98. Pulse signal D is then input to one input 180 of the second NOR gate 124. The pulse lengthening select signal CHSW 212 is low, and thus, the signal output from the fourth NAND gate 136 is high and the signal output from the second inverter 140 is low. Pulse signal D propagates through the third and fourth NOR gates 126 and 128, respectively, because the signal output from the second inverter 140 is low and the mode select signal CLKMODE 208 is low. As a result, the pulse signal D is delayed by a second delay time of two gate. After propagating through the third and fourth NOR gates, the pulse signal D is input to the other input 198 of the second NOR gate. The output of the second NOR gate is pulse signal PLS__B 210 having a pulse width 108 of five gate as shown in FIG. 4.

In contrast, if the pulse lengthening select signal CHSW 212 is high, the enable signal CEN 206 is high, and the mode select signal CLKMODE 208 is low, the pulse generator circuit 120 operates in a manner in which the pulse width 108 of output signal PLS__B 210 is seven gate instead of five gate as indicated in FIG. 6. In particular, an input clock signal NCLK 98 having a period 100 of ten gate, as shown in FIG. 4, is input to one input 142 of the first NAND gate 130 and one input 144 of the first NOR gate 122. The input clock signal NCLK, after propagating through the first NAND gate, second NAND gate 132, and first inverter 138, as discussed previously, is also input to the other input 168 of the first NOR gate. The output of the first NOR gate is pulse signal D 102 that has a pulse width 104 of three gate as depicted in FIG. 4. Pulse signal D is then input to one input 180 of the second NOR gate 124 as well as one input 178 of the fourth NAND gate 136. Since the pulse lengthening select signal CHSW is high, pulse signal D propagates through the fourth NAND gate and second inverter 140 and, as a result, is delayed by a third delay time of two gate. Thus, the signal output from the first NOR gate is delayed by the third delay time in response to the value of the pulse lengthening select signal CHSW. After propagating through the fourth NAND gate and the second inverter, the pulse signal D propagates through the third and fourth NOR gates 126 and 128, respectively, as discussed previously, and is input to the other input 198 of the second NOR gate. The output of the second NOR gate is a pulse signal PLS__B that is similar in form to pulse signal PLS__B 106 shown in FIG. 4, however, the pulse width (not shown) is seven gate instead of five gate and is longer than half the period 100 of the input clock signal NCLK. The series combination of the fourth NAND gate and the second inverter is commonly referred to as a "chicken switch", third logic means, or third logic element 218 that is enabled when the pulse lengthening select signal CHSW is high.

A comparison of FIGS. 3 and 5 shows that the chicken switch 218 of FIG. 5 can be incorporated into the pulse generator circuit 40 of FIG. 3 by replacing the fourth inverter 52 with the fourth NAND gate 136, second inverter 140, third NOR gate 126 and their previously described couplings to one another and the input signal CHSW 212 a shown in FIG. 5. Similarly, additional chicken switches can be added to the pulse generator circuit that widen the pulse width 108 of the output signal PLS_B 106 and 210 so long as the pulse width 108 does not exceed the period 100 of the input clock signal NCLK 98.

Therefore, in addition to allowing for the output signal PLS_B 210 to have a pulse width 108 of five gate which is half of the period 100 of the input clock signal NCLK 98, the pulse generator circuit 120 depicted in FIG. 5 advantageously can be disabled to prevent unwanted dissipation of power, can output either a pulse signal or a periodic signal, and can extend the pulse width of output signal PLS_B to more than half the period 100 of the input clock signal NCLK 98, by means of three different input signals CEN 206, CLKMODE 208, and CHSW 212, respectively. The input clock signal NCLK 98, enable signal CEN 206, mode select signal CLKMODE 208, and pulse lengthening select signal CHSW 212 that are input to the pulse generator circuit embodiments 10, 40, and 120 can be generated by many different sources known to those skilled in the art. Also, in embodiments of the invention, the first, second, third, and fourth NOR gates 122, 124, 126, and 128, respectively, the first, second, third, and fourth NAND gates 130, 132, 134, and 136, respectively, and the first and second inverters 138 and 140, respectively, are co-located within a single chip (not shown), and thus, advantageously provided for reduced space requirements and cost. In other embodiments, any of the first, second, third, and fourth NOR gates, the first, second, third, and fourth NAND gates, and the first and second inverters are configured in more than one chip (not shown).

While the pulse generator circuit embodiments 10, 40, and 120 discussed above and depicted in FIGS. 1-6 deal with an input clock signal NCLK 12 and 98 having a period 30 and 100 of ten gate, embodiments may accept an input clock signal NCLK having a period (not shown) of 2*n gate where n is an integer greater than one. These embodiments include a first delay element (not shown) that includes m series-connected logic gates, for example, inverters and NAND gates, for generating a first delay time, where m is an integer less than n, and m is greater than n-m. These embodiments also include a second delay element (not shown) that includes n-m series-connected logic gates for generating a second delay time. Thus, the first delay element and the second delay element combined include n logic gates. Embodiments may also include a third logic element (not shown) that includes k series-connected logic gates for generating a third delay time, where k is an integer greater than one and k plus n is less than 2*n. In these embodiments, the individual logic gates that comprise the pulse generator circuits (not shown) include the m, n-m, and k series-connected logic gates (not shown) are co-located within a single chip (not shown). In other embodiments, the logic gates are configured in more than one chip (not shown).

Overall, the various embodiments of the present invention represent a general scheme for generating a pulse signal having a pulse width that is approximately equal to or greater than half the period of an input clock signal using a small number of components, and thus, providing a low cost pulse generator circuit.

Moreover, to those skilled in the various arts, the invention itself herein will suggest solutions to other tasks and adaptations for other applications. The present embodiments must therefore be considered in all respects as illustrative and not restrictive. The scope of the invention is not limited to those embodiments, but must be determined instead by the appended claims, along with the full scope of equivalents to which those claims are legally entitled.

What is claimed is:

1. A pulse generator circuit, comprising:
   a first logic element having one input for receiving an input clock signal;
   a first delay element for delaying the input clock signal by a first delay time, the first delay element having one end for receiving the input clock signal and another end coupled to another input of the first logic element;
   a second logic element having one input for receiving a signal output from the first logic element, the one input of the second logic element coupled to an output of the first logic element, wherein a signal output from the second logic element is held at a fixed level in response to a value of an enable signal to the first delay element; and
   a second delay element for delaying the signal output from the first logic element by a second delay time, the second delay element coupled at one end to the output of the first logic element and coupled at another end to another input of the second logic element.

2. The pulse generator circuit according to claim 1, wherein the first logic element comprises a first NOR gate.

3. The pulse generator circuit according to claim 1, wherein the second logic element comprises a second NOR gate.

4. The pulse generator circuit according to claim 1, wherein the first logic element comprises a first NAND gate.

5. The pulse generator circuit according to claim 1, wherein the second logic element comprises a second NAND gate.

6. The pulse generator circuit according to claim 1, wherein the first delay element and the second delay element each include at least one logic gate.

7. The pulse generator circuit according to claim 1, wherein the first delay element comprises:
   a first NAND gate having an input for receiving the input clock signal;
   a second NAND gate having an input coupled to an output of the first NAND gate; and
   a first inverter having an input coupled to an output of the second NAND gate and an output coupled to another input of the first logic element.

8. The pulse generator circuit according to claim 7, wherein the first NAND gate includes another input for receiving the enable signal, a signal output from the second logic element is held at a fixed value in response to a value of the enable signal.

9. The pulse generator circuit according to claim 7, further comprising a third NAND gate having an input coupled to another input of the first NAND gate, another input for receiving a mode select signal, and an output coupled to another input of the second NAND gate,
   wherein a signal output from the second logic element is a pulse signal or a periodic signal in response to a value of the mode select signal; and wherein the second delay element comprises:
   a first NOR gate having an input for receiving a signal output from the first logic element; and
   a second NOR gate having an input coupled to an output of the first NOR gate, another input for receiving the mode select signal and an output coupled to another input of the second logic element.

10. The pulse generator circuit according to claim 1, further comprising a third logic element coupled between the output of the first logic element and the second delay element for delaying the signal output from the first logic element by a third delay time.

11. The pulse generator circuit according to claim 10, wherein the signal output from the first logic element is delayed by the third delay time in response to a value of a pulse lengthening select signal.

12. The pulse generator circuit according to claim 10, wherein the third logic element comprises:
   a first NAND gate having an input for receiving the signal output from the first logic element; and
   an inverter having an input coupled to an output of the first NAND gate.

13. The pulse generator circuit according to claim 12, wherein the first NAND gate includes another input for receiving a pulse lengthening select signal and the signal output from the first logic element is delayed by the third delay time in response to the pulse lengthening select signal.

14. The pulse generator circuit according to claim 1, wherein the second delay element comprises:
   a first NOR gate having an input for receiving the signal output from the first logic element; and
   a second NOR gate having an input coupled to an output of the first NOR gate and an output coupled to another input of the second logic element.

15. The pulse generator circuit according to claim 1, wherein a pulse width of a pulse signal output from the second logic element is greater than half a period of the input clock signal.

16. The pulse generator circuit according to claim 1, wherein the first delay time is less than half a period of the input clock signal.

17. The pulse generator circuit according to claim 1, wherein the output signal from the second logic element is periodic and has a period approximately equal to the input clock signal.

18. The pulse generator circuit according to claim 1, wherein the first logic element, the second logic element, the first delay element, and the second delay element are located in a single chip.

19. The pulse generator circuit according to claim 1, wherein a signal output from the second logic element is a pulse signal or a periodic signal in response to a value of a mode select signal input to both the first delay element and the second delay element.

20. The pulse generator circuit according to claim 1, wherein the first delay element and the second delay element combined include n logic gates, where n is an integer larger than one and the period of the input clock signal is 2*n gate.

21. The pulse generator circuit according to claim 20, further comprising a third logic element including k logic gates, where k is an integer and k plus n is less than 2*n, wherein the third logic element is coupled between the output of the first logic element and the second delay element.

22. A pulse generator circuit, comprising:
   a first logic means for receiving an input clock signal;
   a first delay means for delaying the input clock signal by a first delay time;
   a second logic means for receiving a signal output from the first logic means, wherein a signal output from the second logic means is held at a fixed level in response to a value of an enable signal input to the first delay means; and
   a second delay means for delaying the signal output from the first logic means by a second delay time.

23. The pulse generator circuit according to claim 22, wherein the first logic means, the second logic means, the first delay means, and the second delay means are located in a single chip.

24. The pulse generator circuit according to claim 22, further comprising a third logic means for delaying the signal output from the first logic means by a third delay time.

25. The pulse generator circuit according to claim 24, wherein the signal output from the first logic means is delayed by the third delay time in response to a value of a pulse lengthening select signal.

26. The pulse generator circuit according to claim 22, wherein a signal output from the second logic means is a pulse signal or a periodic signal in response to a value of a mode select signal input to both the first delay means and the second delay means.

27. A method for generating a pulse signal, the method comprising:
   receiving an input clock signal at an input of a first logic element;
   delaying the input clock signal by a first delay time;
   receiving the input clock signal delayed by a first delay time at another input, of the first logic element;
   receiving an output signal from the first logic element at an input of a second logic element;
   holding an output signal from the second logic element at a fixed level based on a value of an enable signal;
   delaying the output signal from the first logic element by a second delay time; and
   receiving the output signal from the first logic element delayed by the second delay time at another input to the second logic element.

28. The method according to claim 27, further comprising delaying the output signal from the first logic element by a third delay time before the output signal from the first logic element is received by the second logic element.

29. The method according to claim 28, further comprising delaying the output signal from the first logic element by the third delay time based on a value of a pulse lengthening select signal.

30. The method according to claim 27, further comprising outputting a periodic signal from the second logic element based on a mode select signal.

* * * * *